United States Patent [19]

Okayasu

[11] Patent Number: 5,491,673
[45] Date of Patent: Feb. 13, 1996

[54] TIMING SIGNAL GENERATION CIRCUIT

[75] Inventor: Toshiyuki Okayasu, Kurihashi, Japan

[73] Assignee: Advantest Corporation, Tokyo, Japan

[21] Appl. No.: 346,876

[22] Filed: Nov. 30, 1994

[30] Foreign Application Priority Data

Jun. 2, 1994 [JP] Japan ................................. 6-143950

[51] Int. Cl.⁶ .............................. G04F 8/00; H03K 5/159
[52] U.S. Cl. ............................................. 368/120; 327/158
[58] Field of Search ........................... 368/113, 118–120, 368/156; 327/144–156, 158–161

[56] References Cited

U.S. PATENT DOCUMENTS

| | | | |
|---|---|---|---|
| 4,516,861 | 5/1985 | Frew et al. | 368/120 |
| 4,788,670 | 1/1988 | Hofmann et al. | 368/119 |
| 4,982,387 | 1/1991 | Trent | 368/120 |

Primary Examiner—Vit W. Miska
Attorney, Agent, or Firm—Knobbe, Martens, Olson & Bear

[57] ABSTRACT

A timing generator which is capable of generating a timing signal with high resolution and accuracy which is not affected by the changes in temperature and power supply voltage or the self-generated heat of the circuit component. The timing signal generator can generate a timing signal which has a delay time combined with a large delay time which is greater than the clock signal period and a small delay time which is smaller than the clock signal period. The timing signal generator includes a plurality of variable delay devices serially connected one another, a phase comparator which compares a total delay time of the variable delay devices with a clock signal and generates a voltage signal indicative of the difference between the two, a feed back circuit that feeds back the voltage signal from the phase comparator to the variable delay devices to form a phase locked loop so that the total delay time in the variable delay devices is equal to the one period of the clock signal, a synchronous delay circuit for generating a large delay time which is proportional to the clock signal period, a selector circuit for selecting one combination of the large delay time from the synchronous delay circuit and a small delay time from one of the variable delay devices.

7 Claims, 7 Drawing Sheets

Fig. 1

Fig. 2A CLK
Fig. 2B
Fig. 2C φ1
Fig. 2D φ2  (m=4)
Fig. 2E φ3
Fig. 2F φ4
Fig. 2G

TIMING SIGNAL GENERATION CIRCUIT

The present invention relates to a timing signal generation circuit that generates a high-resolution timing signal for use in, for example, an electric apparatus such as an IC test system. The resolution and accuracy of the timing signal of this invention is not affected by the variation of temperature or power supply voltages.

BACKGROUND OF THE INVENTION

Figure 6:
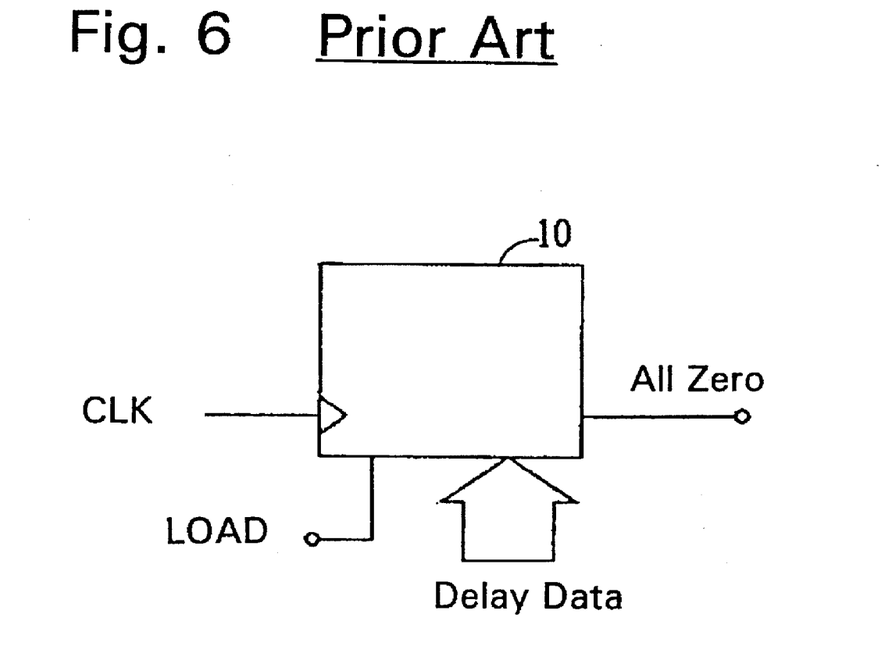
FIG. 6 is a block diagram showing a conventional timing signal generation circuit using a synchronous delay counter.

As the speed of an electronic circuit increases, there is a strong demand for generating a timing signal with high resolution and high accuracy. FIG. 6 shows a conventional structure of a timing signal generation circuit utilizing a synchronous down counter 10. In this example, delay data is set to the synchronous down counter 10 by a LOAD signal, and the delay data is synchronously down counted by a clock (CLK) signal. When the down counter 10 reaches "0", an All-Zero signal is generated at its output, which is a timing signal showing the delay time of an integer multiple of the clock signal period.

In this conventional example, an accurate timing signal is obtained by utilizing a clock signal which is generated by utilizing a crystal oscillator with high stability. However, since there is a limit in the speed of the synchronous down counter 10, it is not practically possible to generate a higher resolution signal, such as a timing signal having a repetition rate of 10 nanosecond or less by using a clock signal period of 10 nanosecond or less.

Figure 7:
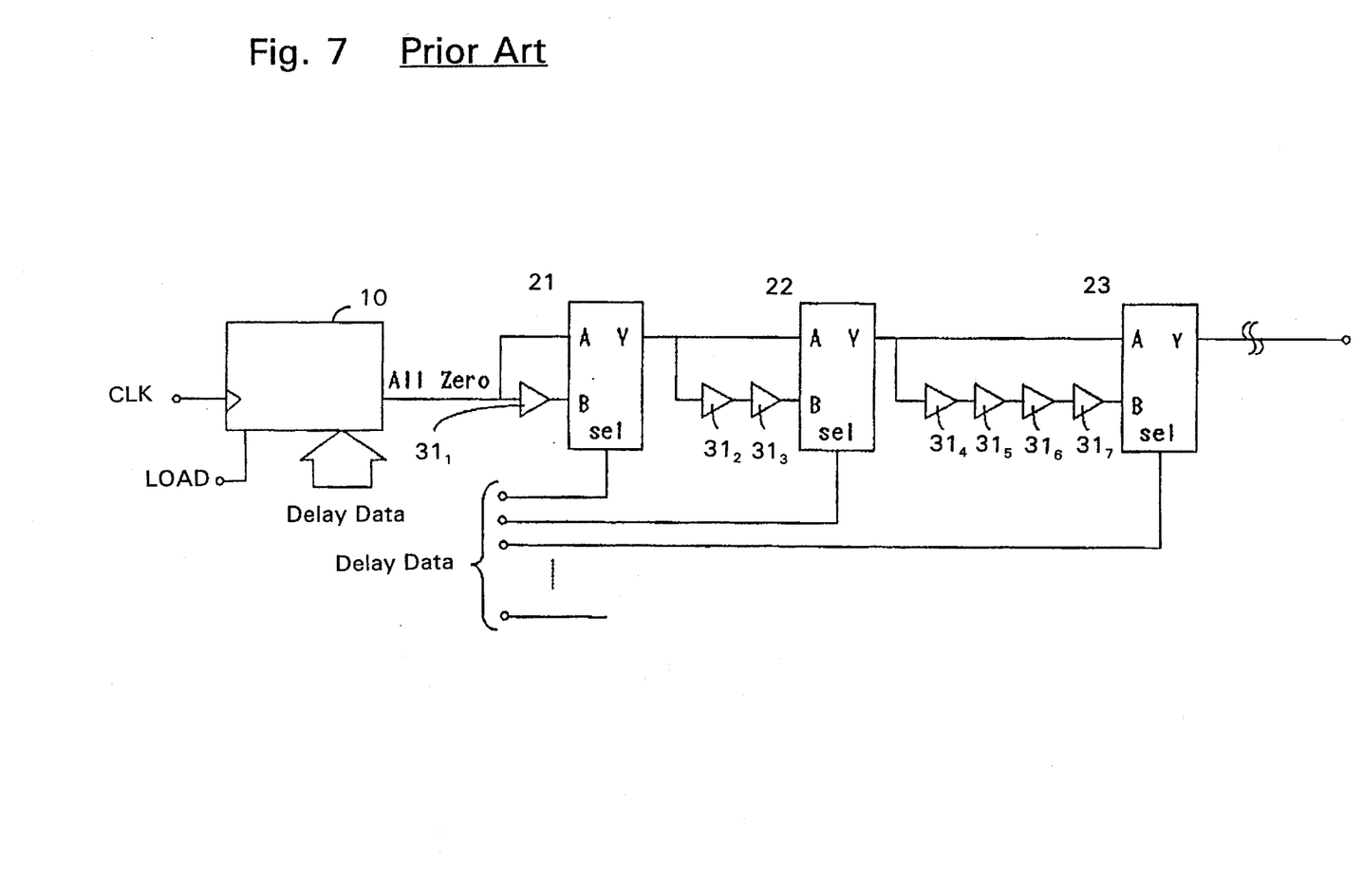
FIG. 7 is a block diagram of the conventional circuit structure for generating a timing signal having a delay time smaller than the clock signal period.

FIG. 7 shows an another example of conventional circuit diagram that generates a timing signal having a smaller delay time than a clock signal period. In this example, the output of the synchronous down counter 10 is connected to input terminals A of a series of selectors 21–23. The other input terminals B of the selectors 21–23 are connected to the output of the counter 10 through buffers $31_1$–$31_7$ in a manner shown in FIG. 7.

More precisely, the input terminal A of the selector 21 is directly provided with the output of the counter 10 while the input terminal B is provided with the output of the counter 10 though the buffer $31_1$. The input terminal A of the selector 22 is directly provided with the output of the selector 21 while the input terminal B is provided with the output of the selector 21 through the buffer $31_2$ and $31_3$. Similarly, the input terminal A of the selector 23 is directly provided with the output of the selector 22 while the input terminal B is provided with the output of the selector 22 through the buffers $31_4$–$31_7$. Each of the buffers $31_1$–$31_7$ has a delay time which is smaller than the clock signal period. The delay data is supplied to the synchronous down counter 10 and the selectors 21–23, respectively. The output of the last stage selector, in this example, the selector 23 is used as a timing signal.

In this arrangement, an All-Zero signal which is an output signal from the down counter 10 is input to the input terminal A of the selector 21, and at the same time to the input terminal B via the buffer $31_1$. By selecting either the terminal A or the terminal B of the selector 21 by the delay data, timing signals having a timing difference of a propagation delay time of the buffer $31_1$ can be generated at an output terminal Y.

An output signal from the selector 21 is input to the terminal A of the selector 22, and at the same time to the terminal B via two stages of the buffers $31_2$ and $31_3$. By selecting either the terminal A or the terminal B of the selector 22 by the delay data, timing signals having a timing difference of a sum of delay times of the buffers 312 and 313 can be generated at an output terminal Y.

Similarly, an output signal of the selector 22 is provided to the input terminal A of the selector 23, and at the same time to the terminal B terminal of the selector 23 via four stages of buffers $31_4$–$31_7$. By selecting either the terminal A or the terminal B of the selector 23 by the delay data, timing signals having a timing difference of a sum of delay times of the buffers $31_4$–$31_7$.

The more increased number of delay times are available by further connecting and selecting buffers, for example, eight stages of buffers or sixteen stages of buffers in a manner described above. Therefore, a timing signal can be generated wherein each delay time step is a portion of a clock signal period.

In this conventional method, since the unit of delay time is set to a propagation time delay Tpd of each buffer 31, there are some drawbacks. Namely, a timing signal error will be incorporated because of the changes in the propagation time delay Tpd of the buffers 31 caused by a change in a power supply voltage of the buffers 31 or a change in temperature surrounding the buffers 31.

Further, a timing signal error will be incorporated because of the discrepancy of propagation delay times between the semiconductor ICs caused by the discrepancy of the IC production process. Furthermore, delay data set to a synchronous down counter 10 changes the number of signals or the number of signals passing through the buffers 31, which will change the self-generated heat of the buffers 31. An error of a timing signal will be further generated by the temperature change caused by this self-generated heat. This drawback is especially prominent in COOS circuit wherein the difference in the consumption of electric power between at rest and in operation is large.

Figure 8:
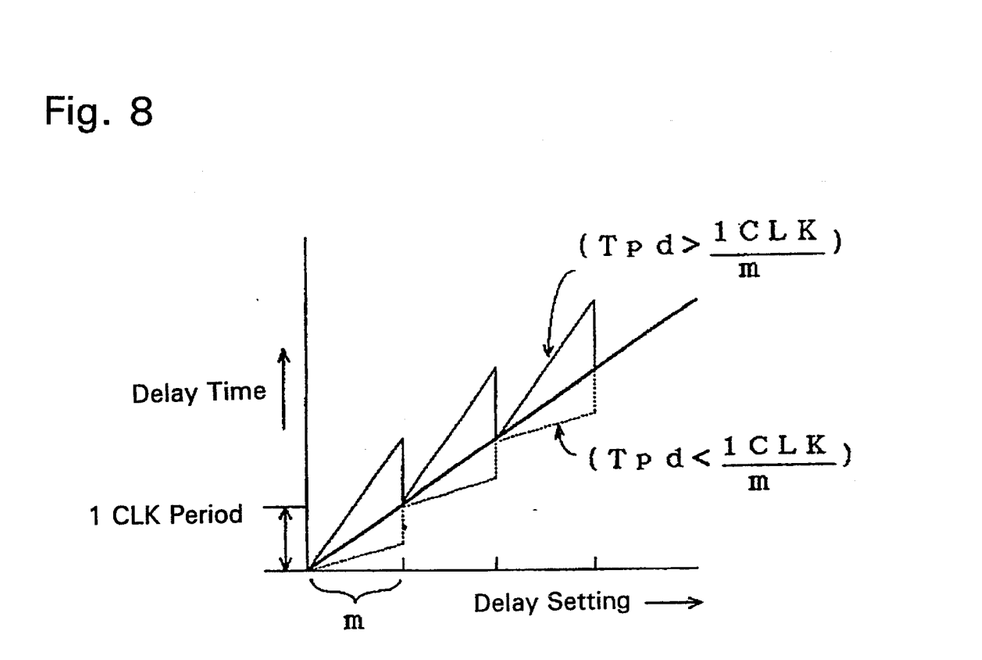
FIG. 8 is a graphic view showing a relationship between the timing signal to be generated and the actual delay times under the conventional circuit of FIG. 7.

The change in the propagation time delay Tpd stated above causes discontinuous points at every clock signal period, as shown in FIG. 8. For example, in case where the clock signal CLK is divided by m buffers 31 as shown in FIG. 8, and if the propagation time delay Tpd is larger than the value of 1/m of the clock signal period, discontinuous points are incorporated in the timing signal as shown at the solid line in FIG. 8. Further, when the propagation time delay Tpd is smaller than 1/m of the clock signal period, discontinuous points are incorporated as shown at the dotted line of FIG. 8.

Aside from the delay time caused by the buffers 31, there is also a delay time involved in a timing signal caused by the plurality of selectors. Although this delay in the selectors will not directly affect the variable delay times in the buffers 31, it affects the timing signal since the selectors are connected in series in the timing signal path, and thus causes additional timing errors in the timing signal by the same reasons described above.

As in the foregoing, in the conventional method of setting delay data for generating a timing signal having an increment of delay time which is smaller than a clock signal cycle, the accuracy of such timing signal is limited. This is because the timing signal inevitably includes errors caused by the changes of temperature and power supply voltage in the IC which incorporates timing signal generation circuit, non-uniformity in the IC characteristics, the temperature changes caused by the changes in the self-generated heat of the buffers, and the time delay and the change thereof caused in a plurality of selector circuits. Thus, it is not possible to generate a high resolution and accuracy timing signal in the conventional method.

SUMMARY OF THE INVENTION

Therefore, it is an object of the present invention to provide an improved timing generator which is capable of generating a timing sinal with high resolution and accuracy which is not affected by the changes in temperature and power supply voltage or the self-generated heat of the circuit component.

In order to achieve the goal described above, a timing generator of the present invention includes a variable delay circuit having a plurality (m) of variable delay devices serially connected each other and receive a clock signal, a phase lock loop circuit having a phase comparator which compares an output of the variable delay devices and the clock signal, and a feedback circuit which causes an output of the phase comparator to return to the plurality of the variable delay devices to control the propagation delay times thereof. The variable delay circuit thus formed establishes m steps of variable delay elements having a delay time increment of 1/m of the clock signal period.

The timing signal generator also includes a timing signal selector circuit which is comprised of a synchronous delay circuit, a decoder and a selector circuit. The synchronous delay circuit determines a delay time which is an integer multiple of the clock signal period based on delay data provided to the synchronous delay circuit. The delay data indicates an overall delay time of the timing signal to be generated. The upper bits of the delay data is used to determine the integer multiple of the clock by the synchronous delay circuit. The lower bits of the delay data is used to determine the integer multiple of the 1/m of the clock period.

A combination of an output signal of the synchronous delay circuit and a select signal from the decoder select one of the outputs of the m stages of variable delay devices described above. The decoder decodes the lower bits of the delay data. The selected output of the variable delay device is output from the selector circuit with the timing determined by the output of the synchronous delay circuit so that the timing signal having the integer multiple of the clock signal period and the integer multiple of the small step of the 1/m clock signal period.

In this structure of the present invention, since the synchronous delay circuit is independent from the timing signal select circuit, only one phase lock loop circuit can provide m steps of delay signals having a short delay of 1/m clock signal period to a plurality of the timing signal selector circuits.

By utilizing the method described above, since the m steps of variable delay devices constantly operate and synchronized with the clock signal period with high accuracy, the self-heat-generation from the variable delay devices is always constant and stable. Further, the output of the variable delay devices is phase locked with the clock signal, the delay time in each of the delay devices is controlled to be constant even under the changes of atmospheric temperature or supply power voltage. Further, since the variable delay devices are formed by the semiconductor element proximately arranged one another in an IC chip under the same production process, the characteristics and thus the signal propagation delay time in each of the delay devices is identical and highly accurate which has a resolution of 1/m of the clock signal period.

DETAILED DESCRIPTION OF THE INVENTION

Figure 1:
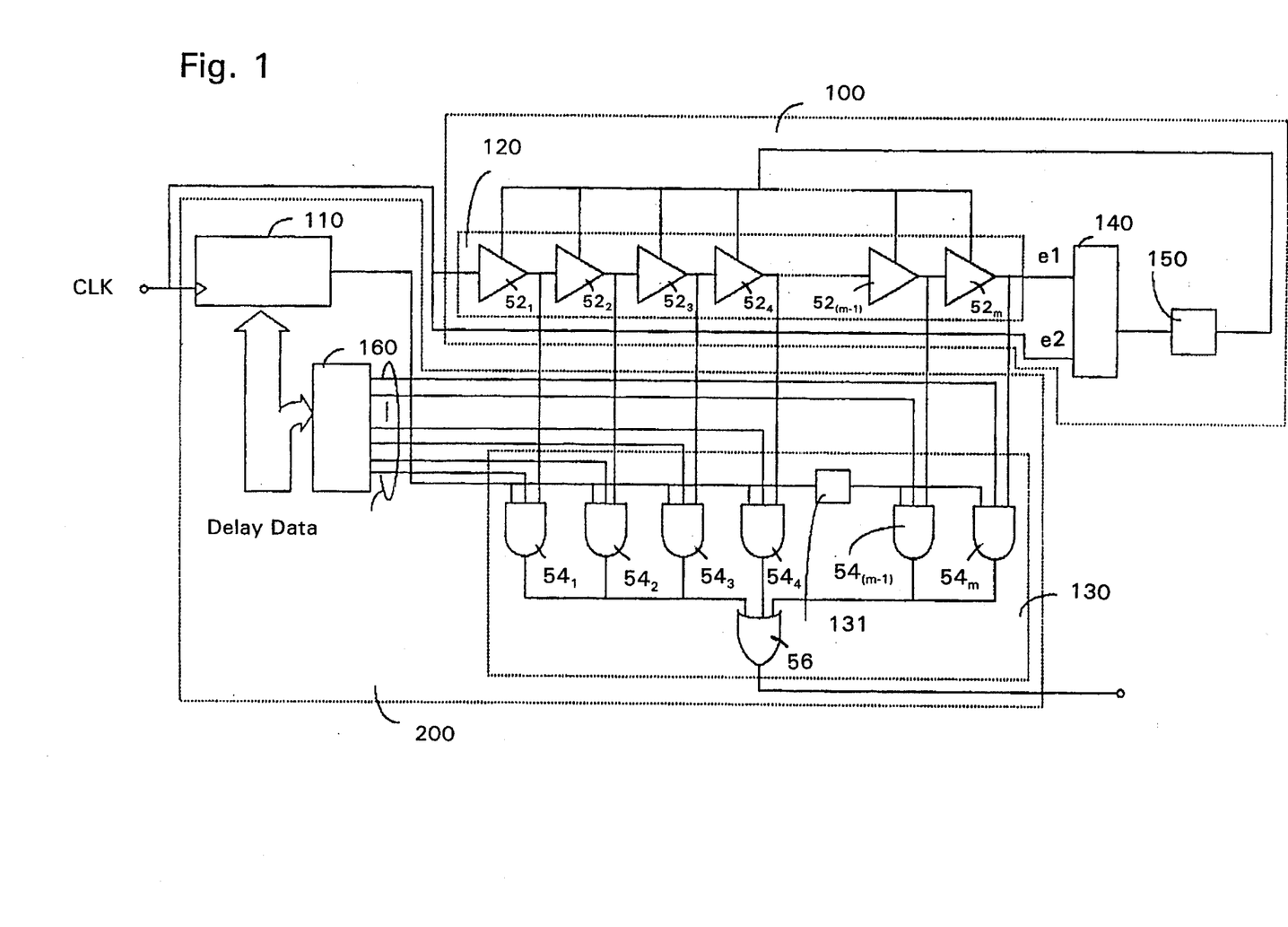
FIG. 1 is a block diagram showing an embodiment of the timing signal generator circuit in accordance with the present invention.
Figure 2A:
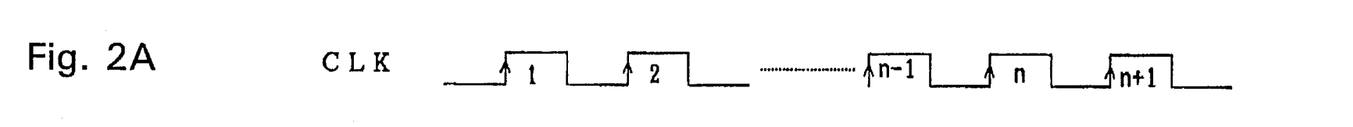
FIG. 2 is a timing diagram for showing the operational timing relationship of the present invention wherein the number of delay increment m is set to 4.
Figures 2B, 2C:
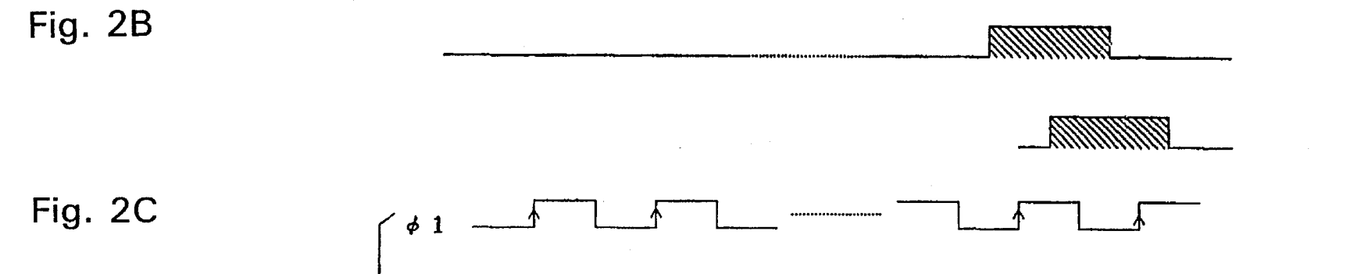
Figure 2D:
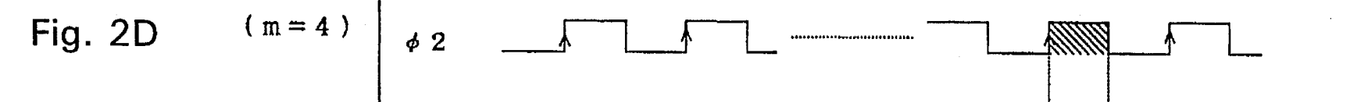
Figure 2E:
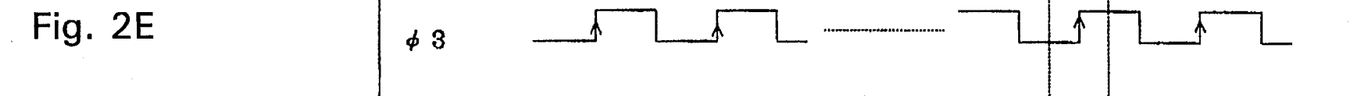
Figures 2F, 2G:
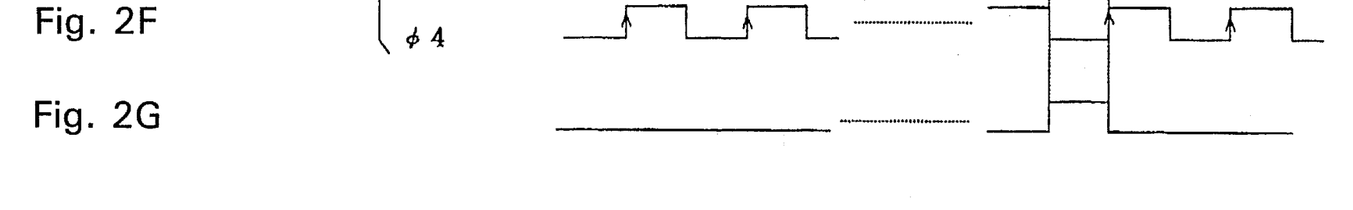

FIG. 1 shows an embodiment of a timing signal generation circuit of the present invention. The timing signal generation circuit includes a variable delay circuit 120, a phase comparator 140, a feedback circuit 150, a selector circuit 130, a synchronous delay circuit 110 and a decoder 160. A clock signal CLK is supplied to the synchronous delay circuit 110 and the phase comparator 140. Delay data is provided to the synchronous delay circuit 110 and to the decoder 160. The synchronous delay circuit 110, the decoder 160 and selector 130 form a timing signal selection circuit 200 for generating a channel of timing signal. A structure of generating timing signals in a plurality of channels is will be described later with reference to FIG. 5.

The variable delay circuit 120 has m stages of variable delay devices $52_1$–$52_m$ which are serially connected to create m increments of a small delay time. The number m is a timing value which divides one clock signal period into m fractions. Each variable delay devices $52_1$–$52_m$ has an identical delay time, i.e, a signal propagation time and each output is taken out to form the variable delay time depending on the delay data provided to the timing signal generation circuit of FIG. 1. Thus, the variable delay time is a delay time or a sum of the delay times up to the m steps of variable delay devices $52_1$–$52_m$.

The total amount of variable delay time in the variable delay devices $52_1$–$52_m$ is controlled by the feedback loop circuit so that the total variable delay time is equal to the time of one clock signal period. In this situation, delay time of each variable delay device is identical with each other, since all the variable delay devices have identical structure and formed in a substantially close proximity in an IC chip and controlled exactly the same way by the feedback circuit.

The phase comparator 140 is a circuit which outputs an electric current or voltage proportional to a phase difference between signals supplied to two input terminals e1, e2 of the phase comparator 140. A charge pump may be included in the phase comparator 140. The phase comparator in FIG. 1 is provided with the clock signal CLK to the terminal e2 and the sum of variable delay time produced by the variable delay devices $52_1$–$52_m$ from the last stage of the variable delay device $52_m$. Thus, the total delay time of the variable delay devices $52_1$–$52_m$ is controlled to be equal to one period of the clock signal CLK.

The feedback circuit 150 receives the electric signal from the phase comparator 140 indicative of the timing difference between the total delay time from the variable delay devices $52_1$–$52_m$ and the clock signal period. The feedback circuit determines frequency characteristic of a negative feedback loop which is well known in the art. Therefore, the feedback circuit may include a loop filter, for example, a low pass filter therein.

The selector circuit 130 includes AND gates $54_1$–$54_m$ having, for example, three inputs one of which is connected to a corresponding output of each of the variable delay devices $52_1$–$52_m$. Each of the other input of the AND gates $54_1$–$54_m$ is provided with a selector signal from the decoder 160 which is indicative of lower bits of the delay data. The remaining each input of the AND gates $54_1$–$54_m$ is provided with an output signal from the synchronous delay circuit 110. In a preferred embodiment, a delay circuit 131 is additionally employed to adjust the timing difference between the output signal from the synchronous delay circuit 110 and the sum of the delay times from the variable delay devices. Outputs of the AND gates $54_1$–$54_m$ are connected to an OR gate 56 which generates a timing signal at its output.

The synchronous delay circuit 110 is, for example, a synchronous counter which presets a certain value based on the higher bits of the delay data and down counts the preset value by the clock signal CLK to generates All-zero signal at its output when the content in the synchronous delay circuit 100 reaches zero. Therefore, the output of the synchronous delay circuit is an integer multiple of the clock signal period and is supplied to each input terminal of the AND gates $54_{1-54m}$. Thus, the combination of the output of the synchronous delay circuit 110 and the select signal from the decoder 160 determines which one of the AND gates $54_1$–$54_m$ should be open to select the variable delay time of the corresponding variable delay devices 52.

The decoder 160 generates, as stated above, the select signal based on the lower bits of the delay data and provides the select signal to the AND gates $54_1$–$54_m$. The select signal determines which one of the AND gates 54 be active to pass the delay time therethrough. Thus, the select signal from the decoder selects one out of m increments of delay time from the variable delay devices $52_1$–$52_m$ in the variable delay circuit 120.

As described above, generation of the large delay time which is an integer multiple of the clock signal period is accomplished by the synchronous delay circuit 110 by using the conventional means as noted above. In order to generate the fine delay time having a resolution of 1/m of the clock signal period, the feed back circuit 150 equally controls the delay times in the variable delay devices $52_1$–$52_m$ in the variable circuit 120 so that the delay time of one variable delay device 52 is equal to the 1/m of the clock signal period. Hence, the total delay time of the variable delay devices $52_1$–$52_m$ is equal to one clock signal period.

The output of each of the variable delay devices $52_1$–$52_m$ in the variable delay circuit 120 is the same and is equal to 1/m of the clock signal period, since the variable delay devices $52_1$–$52_m$ have the same structure and formed in close proximity with each other in the IC chip and controlled in the same manner by the feedback loop. The selector circuit 130 selects one of the outputs of the m stages of the variable delay devices $52_1$–$52_m$ based on the select signal from the decoder 160 to determine the small delay time of the timing signal. The selector circuit 130 is also controlled by the output of the synchronous delay circuit 110 to determine the large delay time of the timing signal which is the integer multiple of the clock signal period.

FIG. 2 is a timing chart showing the operation of the timing signal generating circuit of the present invention wherein the number of increments in the fine delay time is set to m=4. The synchronous delay circuit 110 calculates the clock signal CLK (FIG. 2A) n times, where n is indicated in the upper bits of the delay data. The synchronous delay circuit 110 generates an output signal as shown in FIG. 2B in synchronism with n-th clock signal.

During the period of this output signal (shaded period of FIG. 2B), the selector circuit 130 is activated by this output signal to select one signal from m phases of clock signal CLK ($\phi1$, $\phi2$, $\phi3$ and $\phi4$ in FIGS. C–D) by the select signal from the decoder 160 based on the lower bits of the delay data. In the example, the delay time increment $\phi2$ is selected by the select signal at the timing of the output signal of the synchronous delay circuit 110 (shaded pulse in FIG. 2D). Then selector circuit 130 generates a timing signal at the output of the OR gate 56.

In this situation, the delay time from the latter stages of variable delay devices $52_1$–$52_m$ may be limited in its pulse width because it is generated in the latter half of the output signal from the synchronous delay circuit 110. Therefore, in the preferred embodiment, the delay circuit 131 is used to delay the output signal from the synchronous delay circuit 110 to adjust the timing with the selected delay time from the variable delay devices $52_1$–$52_m$ so that the timing signal output derived from the selected $\phi2$ delay time will not be narrowed in its pulse width. Although not shown, similar timing adjustment can be incorporated in the selector circuit 130 to adjust the timing of the selector signal from the decoder 160 to the selector circuit 130.

Figure 3A:
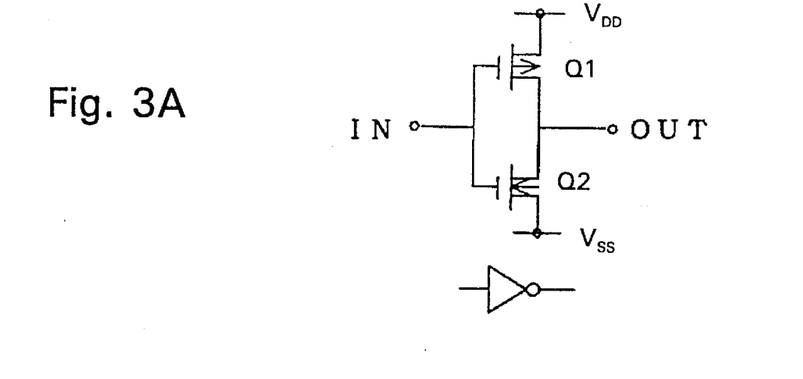
FIGS. 3a and 3b are circuit diagrams showing examples of variable delay devices whose propagation delay time is controlled by a supply voltage.
Figure 3B:
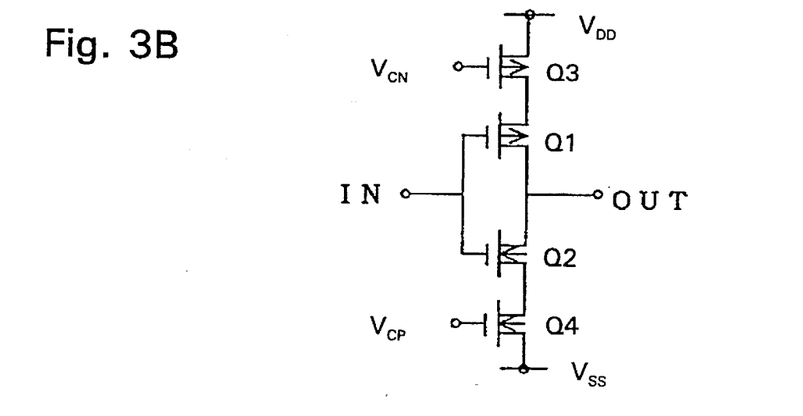

FIG. 3 shows examples of variable delay devices the propagation delay time of which can be controlled by changing a supply voltage to the variable delay devices. FIG. 3a shows an ordinary type of COOS inverter or buffer. A propagation delay time Tpd can be controlled by changing either or both of the power supply voltages $V_{DD}$ and $V_{SS}$. FIG. 3b shows another type of circuit configuration which can be used as the variable delay device. The propagation delay time Tpd can be controlled by changing the ON resistance in MOS transistors Q3 and Q4 by varying the input voltages $V_{CN}$ and $V_{CP}$ to the transistors Q3 and Q4. Thus, in the example of FIG. 3b, the delay time is controlled by the input voltages of the transistors rather than the supply voltage to the delay devices.

Figure 4:
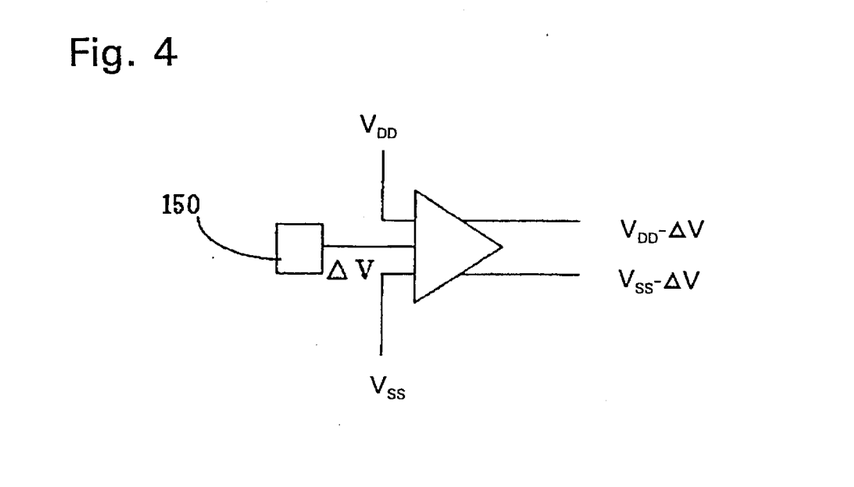
FIG. 4 is a circuit diagram showing an example of a driver which can be used in the variable delay device of the present invention.

For both circuits in FIG. 3a and 3b, the delay time is controlled by changing two values. However, a delay time can also be controlled by changing only one voltage value while fixing the other voltage value. FIG. 4 shows further example of a driver for controlling the delay time by changing the two voltages for the delay devices.

Figure 5:
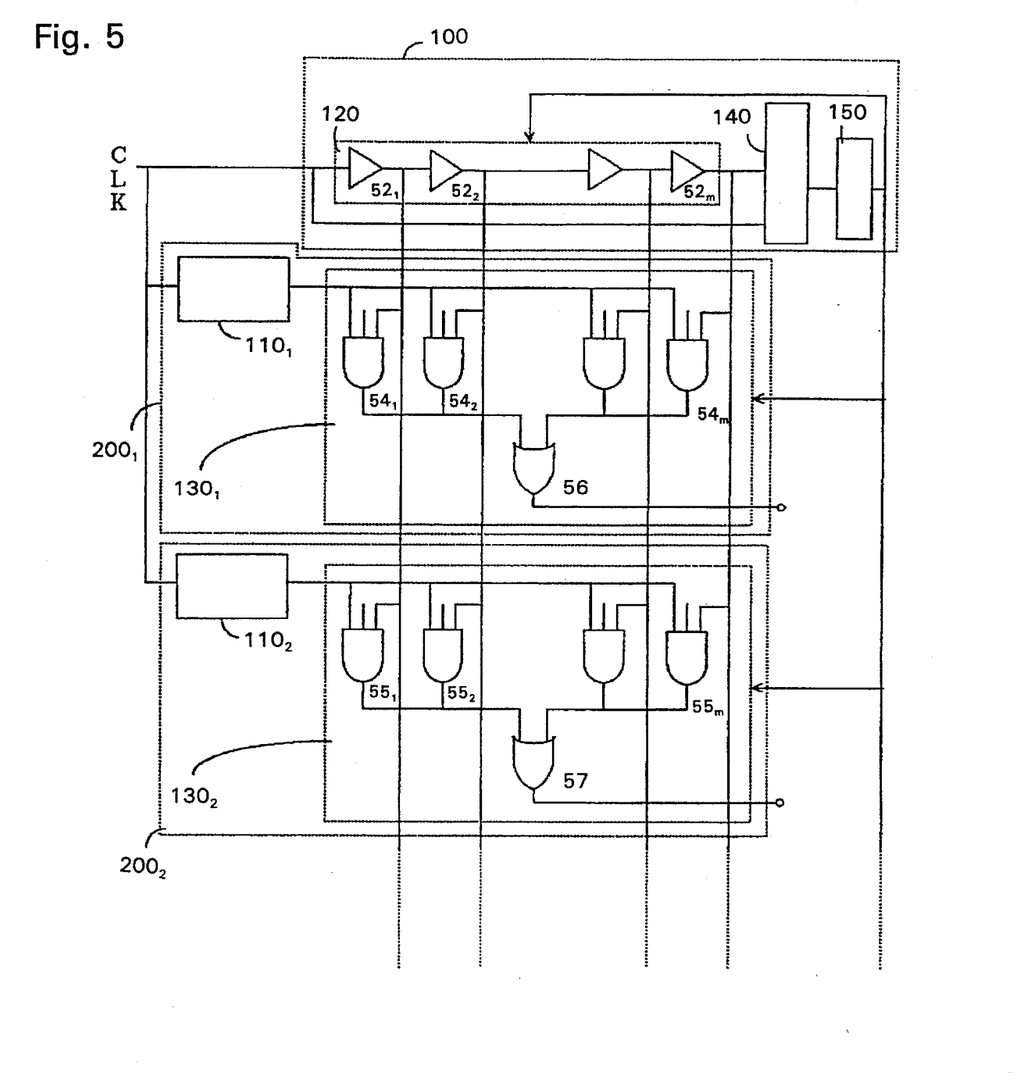
FIG. 5 is a block diagram showing another embodiment of the timing signal generator for generating a plurality of timing signals at the same time in accordance with the present invention.

FIG. 5 shows a circuit configuration for generating a plurality of timing signals each of which has a high resolution and accuracy delay time as described with reference to FIG. 1. In the example of FIG. 5, the variable delay circuit 120 having the variable delay devices $52_1$–$52_m$, the phase comparator 140 and the feedback circuit 150 form the phase lock circuit as in the same way as described in FIG. 1. The variable delay circuit 120 is synchronized with the clock CLK by the phase lock circuit. Thus, the total delay time of the variable delay devices $52_1$–$52_m$ is locked to one period of the clock signal CLK.

A plurality of timing signal selection circuits $200_1$ and $200_2$ are provided to generate a plurality of timing signals. The timing signal selection circuits $200_1$ and $200_2$ have the same circuit configuration as discussed with reference to FIG. 1. Namely, the circuit components in the selection circuit $200_1$ are a synchronous delay circuit $110_1$ and a selector circuit $130_1$. In the selector circuit $130_1$, there are a plurality of AND gates $54_1$–$54_m$ and an OR gate 56. The circuit components in the timing signal selection circuit $200_2$ includes a synchronous delay circuit $110_2$, and a selector circuit $130_2$. The selector circuit $130_2$ is comprised of a plurality of AND gates $55_1$–$55_m$ and an OR gate 57.

In this arrangement, the selector circuits $130_1$ and $130_2$ can select a large amount of delay time determined by the synchronous delay circuits $110_1$ and $110_2$, respectively. In addition, each of the AND gates $54_1$–$54_m$ and $55_1$–$55_m$ receives the corresponding small delay times from each output of the variable delay devices $52_1$–$52_m$. Thus, each of the selector circuits $130_1$ and $130_2$ can generate a timing signal having a large delay time which is the integer multiple of the clock signal period combined with a small delay time which is the integer multiple of 1/m of the clock signal period.

In the example of FIG. 5, the output of the feedback circuit 150 is also provided to each selector circuits $130_1$ and $130_2$ to control the propagation delay times therein. As described with reference to FIGS. 1–3, the output signal from the feedback circuit 150 controls the supply voltages of the circuit components, such as COOS, of the variable delay devices $52_1$–$52_m$. Preferably, as in FIG. 5, not only controlling the voltages of the variable delay devices $52_1$–$52_m$, the feedback circuit 150 also control the voltages in other circuit components, such as the AND gates $54_1$–$54_m$, the OR gate 56, the AND gates $55_1$–$55_m$ and the OR gate 57, since the signal propagation time in these circuit components are also affected by the temperature and the supply voltages.

Since the selector circuits $130_1$, $130_2$ and the variable delay devices $52_1$–$52_m$ are formed of the same semiconductor material such as COOS and in close proximity one another, and thus show substantially the same temperature and voltage characteristics, the voltage control as shown in FIG. 5 is effective in compensating the fluctuation of the propagation delay time in these selector circuits $130_1$ and $130_2$.

Due to the construction stated above, a timing signal can be generated with high accuracy and resolution each increments of which is smaller than a CLK period, and the timing signal is not affected by the temperature change or the differences of circuit components characteristics caused by the differences in the productions or the change in the self-heat-dissipation. Hence, the timing signal generator of the present invention is highly advantageous in the integrated circuit test system.

What is claimed is:

1. A timing signal generation circuit, comprising:

a plurality of variable delay devices serially connected one another, each variable delay device having a propagation time delay which is substantially smaller than one period of a clock signal;

a phase comparator which compares a total delay time of said variable delay devices derived from the last stage of said variable delay devices with said clock signal and generates a voltage signal indicative of the difference between the two;

a feed back circuit that feeds back said voltage signal from said phase comparator to said variable delay devices to form a phase locked loop so that said total delay time of said variable delay devices is equal to the one period of said clock signal;

a synchronous delay circuit provided with said clock signal for generating a large delay time which is proportional to said clock signal period;

a selector circuit which is provided with said large delay time from said synchronous delay circuit and small delay times from said variable delay devices for selecting one combination of said large delay time from said synchronous delay circuit and a small delay time from one of said variable delay devices.

2. A timing signal generation circuit as defined in claim 1, further including:

a plurality of said synchronous delay circuits and a plurality of said selector circuits for generating a plurality of timing signals including the small delay times formed by said variable delay devices at the same time.

3. A timing signal generation circuit as defined in claim 1, wherein said synchronous delay circuit forms said large delay time which is an integer multiple of said clock signal period and said variable delay devices form said small delay time which is an integer multiple of 1/m clock signal period, wherein m is the number of said variable delay devices serially connected one another.

4. A timing signal generation circuit as defined in claim 1, wherein said selector circuit is controlled by delay data provided to said synchronous delay circuit and to a decoder, said synchronous delay circuit utilizes upper digits of said delay data to form said large delay time, said decoder utilizes lower digits of said delay data for forming a selector signal to select said small delay time.

5. A timing signal generation circuit as defined in claim 1, wherein a delay element is further provided between said synchronous delay circuit and said selector circuit to adjust the timing between large delay time and said small delay time.

6. A timing signal generation circuit as defined in claim 1, wherein said variable delay devices are formed with close proximity in a semiconductor chip to have the same propagation delay time to one another, said propagation delay time being controllable by a change in a supply voltage.

7. A timing signal generation circuit as defined in claim 2, wherein said plurality of selector circuits are provided with said voltage signal from said feedback circuit to control the signal propagation delay time in said selector circuits.

* * * * *

UNITED STATES PATENT AND TRADEMARK OFFICE
CERTIFICATE OF CORRECTION

PATENT NO. : 5,491,673

DATED : February 13, 1996

INVENTOR(S) : Toshiyuki Okayasu

It is certified that error appears in the above-indentified patent and that said Letters Patent is hereby corrected as shown below:

Column 1/line 31, delete "an";

Column 2/line 32, delete "COOS" and insert --CMOS--;

Column 3/line 3, delete "sinal" and insert --signal--;

Column 4/line 38, delete "is" and insert --as--;

Column 5/line 12, delete "$54_l\text{-}54_m$" and insert --$54_1\text{-}54_m$;

Column 5/line 38, delete "$54_l\text{-}54_m$" and insert --$54_1\text{-}54_m$;

Column 6/line 40, delete "COOS" and insert --CMOS--;

Column 7/line 16, delete "$55_l\text{-}55_m$" and insert --$55_1\text{-}55_m$;

Column 7/line 29, delete "COOS" and insert --CMOS--;

Column 7/line 39, delete "COOS" and insert --CMOS--;

Signed and Sealed this

Twenty-first Day of October 1997

BRUCE LEHMAN

*Attest:*

*Attesting Officer*   Commissioner of Patents and Trademarks